United States Patent [19]

Yusa et al.

[11] Patent Number: 4,717,945
[45] Date of Patent: Jan. 5, 1988

[54] SOLID STATE IMAGE PICK-UP DEVICE WITH A SHUTTER FUNCTION

[75] Inventors: Atsushi Yusa, Ina; Toshimasa Akagi, Hachioji; Tomoji Ishii; Yoshinori Ohta, both of Nagano, all of Japan

[73] Assignee: Olympus Optical Co., Ltd., Japan

[21] Appl. No.: 879,507

[22] Filed: Jun. 27, 1986

Related U.S. Application Data

[63] Continuation of Ser. No. 515,863, Jul. 21, 1983, abandoned.

[30] Foreign Application Priority Data

Jul. 26, 1982 [JP] Japan ................................. 57-128877

[51] Int. Cl.$^4$ ..................... H01L 29/78; H01L 27/14
[52] U.S. Cl. ........................................ 357/24; 357/30
[58] Field of Search ................... 357/24 LR, 24, 30

[56] References Cited

U.S. PATENT DOCUMENTS

| | | | |
|---|---|---|---|
| 3,896,485 | 7/1975 | Early | 357/24 LR |
| 3,965,481 | 6/1976 | Esser | 357/24 |
| 4,028,716 | 6/1977 | van Santen et al. | 357/24 LR |
| 4,131,810 | 12/1978 | Knaver et al. | 357/24 LR |
| 4,148,048 | 4/1979 | Takemoto et al. | 357/24 |
| 4,149,307 | 4/1979 | Henderson | 357/23.9 |
| 4,245,164 | 1/1981 | Funahashi | 357/24 |
| 4,373,167 | 2/1983 | Yamada | 357/24 LR |
| 4,467,341 | 8/1984 | Suzuki | 357/24 |

Primary Examiner—Martin H. Edlow
Assistant Examiner—Robert P. Limanek
Attorney, Agent, or Firm—Parkhurst & Oliff

[57] ABSTRACT

A solid state image pick-up device with a shutter function including a number of charge coupled devices of vertical overflow domain type is disclosed. A light receiving portion comprises a p$^-$ epitaxial layer arranged on a main surface of an n$^+$ substrate and an n$^+$ diffusion surface region is provided in a surface of the p$^-$ layer. A p$^+$ control gate for controlling a potential barrier between the n$^+$ diffusion surface region and the p$^-$ epitaxial layer is formed in the epitaxial layer adjacent to the light receiving portion, and a p well region is formed in the epitaxial layer adjacent to the light receiving portion. During a shutter close period, i.e. before a signal charge storing operation, a control voltage applied to the control gate and a reverse bias voltage applied across the n$^+$ substrate and p$^-$ epitaxial layer are so adjusted that a potential barrier between the epitaxial layer and surface region is made sufficiently small to completely discharge all the charge stored in the light receiving portion into the substrate serving as the overflow drain.

11 Claims, 15 Drawing Figures

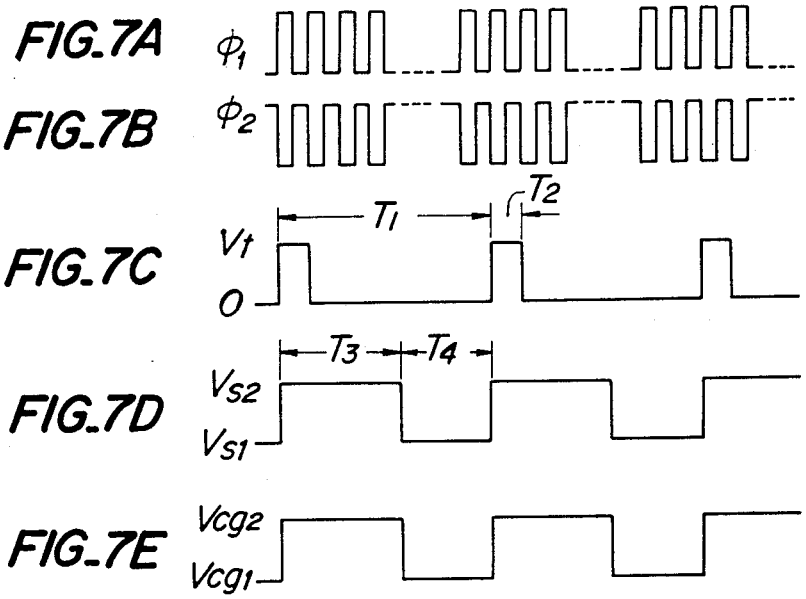
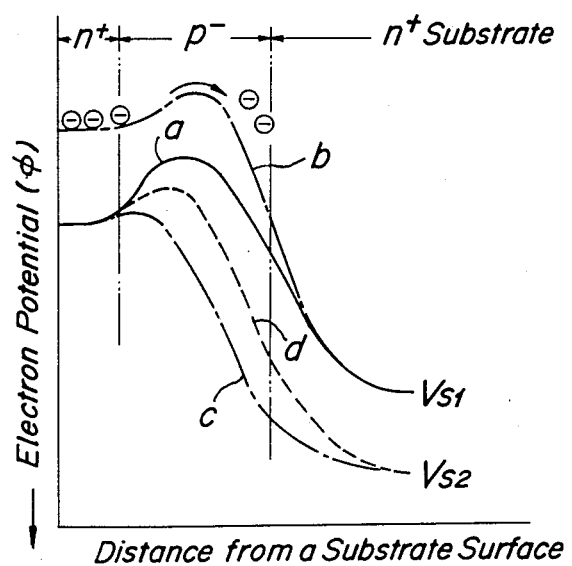

SOLID STATE IMAGE PICK-UP DEVICE WITH A SHUTTER FUNCTION

This is a continuation of application Ser. No. 515,863 filed July 21, 1983, now abandoned.

BACKGROUND OF THE INVENTION

The present invention relates to a solid state image pick-up device with a shutter function comprising a number of charge coupled devices (hereinafter abbreviated as CCD) having a self-scanning function and a photoelectric converting function.

Generally, since the CCD can convert light into an electrical signal charge and can store and transfer the thus converted charge, it is widely utilized as the image pick-up element of the self-scanning type. In the case of using the CCD as the image pick-up element, there has been proposed to give the CCD image pick-up element itself a shutter function by controlling the charge storing period in the light receiving portion effecting the photoelectric converting operation from an external control unit. In this method, a charge transfer portion and an overflow drain portion are arranged adjacent to the light receiving portion through gate electrodes, respectively, and the shutter function is performed in such a manner that the charge stored in the period corresponding to a shutter speed (shutter open period) is transferred to the charge transfer portion and the charge generated in the other period is discharged to the overflow drain portion. The overflow drain (hereinafter abbreviated as OFD) region may be classified into the following two types, i.e. a lateral type in which the OFD region is arranged adjacent to the light receiving portion laterally and a vertical type in which the OFD region is arranged in a depth direction of the substrate. In the vertical OFD type, the stored charge is discharged into the substrate and thus it is possible to attain high sensitivity and high integration as compared with the lateral type.

However, in case of applying the shutter function to the CCD image sensor of the vertical OFD type, disadvantages mentioned hereinafter result.

At first, a typical construction of the CCD image sensor of vertical OFD type will be explained with reference to FIG. 1. In FIG. 1, a substrate 1 is formed by a common n-type semiconductor substrate and a p-type well 2 is formed by an ion implantation of, for example, boron into th n-type substrate 1, a depth of which is made thin partially in the vertical direction of the substrate 1. A light receiving portion 3 is formed on this thin portio of the well 2 and a vertically transferring portion 4 and a transferring gate 5 are arranged side by side on the remaining thick portion of the p-type well 2. The light receiving portion 3 comprises of a photodiode formed by a junction between the p-type well 2 and an n+ surface region 6 formed by diffusion in the surface of the thin portion of the p-type well 2. Moreover, the transferring portion 4 is induced in the p-type well 2 by means of a plurality of shift electrodes 8 which are provided above the well 2 through an insulating layer 7 having a predetermined thickness. The shift electrodes 8 are aligned in the vertical direction, i.e. a direction perpendicular to the plane of the drawings. The transferring gate 5 for controlling the transfer of the charge from the light receiving portion 3 to the transferring portion 4 is induced in a portion of the p-type well 2 between the light receiving portion 3 and the transferring portion 4 by means of a transferring gate electrode 9 provided above the well 2 via the insulating layer 7. Further, a channel stopper 10 is arranged to prevent a leakage of the stored charge from the relevant light receiving portion 3 to adjacent transferring portions 4 and is usually formed by a p+ diffusion region. Furthermore, a light shielding layer 11 is provided to shield all the surfaces other than the light receiving portion 3 from incident light.

Next, an operation of the known image pick-up device having the construction mentioned above will be explained. At first, it is assumed that a reverse bias voltage $V_s$ is applied between the p-type well 2 and n-type substrate 1 as shown in FIG. 1, and the p-type well 2 is in a depletion condition. Then, a distribution of an electron potential $\phi$ viewed from the light receiving portion 3 to the substrate 1 is shown by the curve a in FIG. 2. Under such a condition, when light 12 is made incident upon the light receiving portion 3, electron-hole pairs are generated in the n+ region 6, with the amount of the pairs corresponding to the incident light amount. Then, the thus generated electrons are stored in the n+ region 6 due to an electric field slope and the thus generated holes are discharged to the earth potential through the p-type well 2. In this case, the potential of the n+ region 6 is decreased corresponding to an increase of the stored electrons, and finally the potential thereof has a distribution illustrated by the curve b in FIG. 2. At the same time, the potential of the p-type well 2 becomes small. When a potential difference between the n+ region 6 and the p-type well 2 is substantially equal to a diffusion potential $\phi_b$, the charge stored in the n+ region 6 flows into then-type substrate 1, because the forward bias is applied across the n+ region 6 and the p-type well 2. In this manner, the n-type substrate 1 serves as the overflow drain for discharging the charge out of the light receiving portion 3. In this case, the device must be so constructed that the stored charge does not flow into the transferring portion 4. This may be done by, for example, making an acceptor concentration in a portion of the p-type well situating just below the transferring portion 4 high than that of the light receiving portion 3.

In order to perform the shutter function in the CCD image sensor mentioned above, at first, two clock pulses $\phi_1$ and $\phi_2$ as shown in FIGS. 3A and 3B are alternately applied to each of a plurality of shift electrodes 8. A predetermined pulse voltage $V_t$ having a pulse width $T_2$ shown in FIG. 3C is applied to the transferring gate electrode 9 at a given interval (for example, one field scanning period $T_1$). The pulse width $T_2$ denotes a period during which the signal charge stored in the light receiving portion 3 is transferred to the transferring portion 4 through the opened transferring gate 5. Moreover, a voltage $V_{s2}$ which is higher than a standard voltage $V_{s1}$ is applied to the n-type substrate 1 at a predetermined interval (for example, one field scanning period $T_1$). In a period $T_3$ during which the voltage $V_{s2}$ is applied, the potential distribution is shown by a curve c in FIG. 2. In this case, the potential barrier between the n+ diffusion region 6 and the p-type well 2 becomes smaller than the diffusion potential and thus a part of the stored charge flows into the n-type substrate 1. In a period $T_4$ during which the standard voltage $V_{s1}$ is applied to the substrate 1, the signal charge is always stored. Therefore, it is possible to adjust the charge storing period $T_4$, i.e. the shutter speed to an arbitrary value within the one field scanning period $T_1$ by changing from the external a ratio between the periods $T_4$ and T₃ of the bias voltage across the substrate 1 and the well 2 as shown in FIG. 3D. Further, the charge stored in the shuter opening period T₄ is transferred to the transferring portion 4 during the transferring gate opening period T₂ and further transferred to a vertically transferring portion (not shown) by means of the clock pulses $\phi_1$ and $\phi_2$.

However, in the CCD image sensor of the vertical OFD type mentioned above, since the discharging operation of the signal charge from the n+ region 6 to the n substrate 1 during the period T₃ is performed through the potential barrier between the n+ region 6 and the p-type well 2, a substantial amount of the signal charge is remained in the n+ region 6 even if a sufficiently high reverse bias voltage is applied to the n-type substrate 1. In this case, if the signal charge remaining is large, the sensitivity of the sensor is decreased correspondingly, and also if the amounts remaining of each pixels consisting of the image pick-up element are different from each other, the sensitivities of each pixels vary correspondingly from pixel to pixel.

SUMMARY OF THE INVENTION

The present invention has for its object to eliminate the drawbacks mentioned above and to provide a solid state image pick-up device having a shutter function in which almost all signal charge stored in a light receiving portion can flow into a substrate serving as an overflow drain region in an effective manner during a predetermined period.

It is another object of the invention to provide a solid state image pick-up device having a high, uniform sensitivity.

According to the invention, a solid state image pick-up device with a shutter function including a plurality of charge coupled devices of vertical overflow drain type, comprises a semiconductor substrate of one conductivity type;

an epitaxial layer of a second conductivity type provided on a main surface of the substrate;

surface regions of the one conductivity type formed in a surface of the epitaxial layer, each surface region constituting a light receiving region together with a portion of the epitaxial layer situating underneath the relevant surface region;

well regions of the second conductivity type formed in the epitaxial layer, each well region being provided adjacently to respective surface regions for transferring a signal charge stored in the relevant surface region therethrough;

control gates of the one conductivity type formed in the epitaxial layer, each control gate being provided in the vicinity of the relevant surface region; and means for applying a control voltage to said control gates to control a potential barrier between the surface region and epitaxial layer in such a manner that during a first time period corresponding to a shutter-close time the signal charge stored in the surface region flows into the substrate, and during a second time period corresponding to a shutter-open time the signal charge is stored in the surface region.

In a preferred embodiment of the solid state image pick-up device according to the invention, said semiconductor substrate is formed by a semiconductor body having a high n-type inpurity concentration, said epitaxial layer is formed by an epitaxially grown layer having a low p-type impurity concentration, and said surface region is formed by a diffusion region having a high-type impurity concentration.

Further, in a preferred embodiment of the pick-up device according to the invention, a bias voltage applied across the substrate and epitaxial layer is changed in synchronism with the control voltage applied to the control gate.

BRIEF DESCRIPTION OF THE DRAWINGS

FIGS. 7A to 7E are schematic views illustrating voltage waveforms applied to the device shown in FIGS. 4 to 6; and FIG. 8 is a graph showing potential distribution curves in a depth directin of a substrate of the device according to the invention.

DESCRIPTION OF THE PREFERRED EMBODIMENTS

Figure 1:
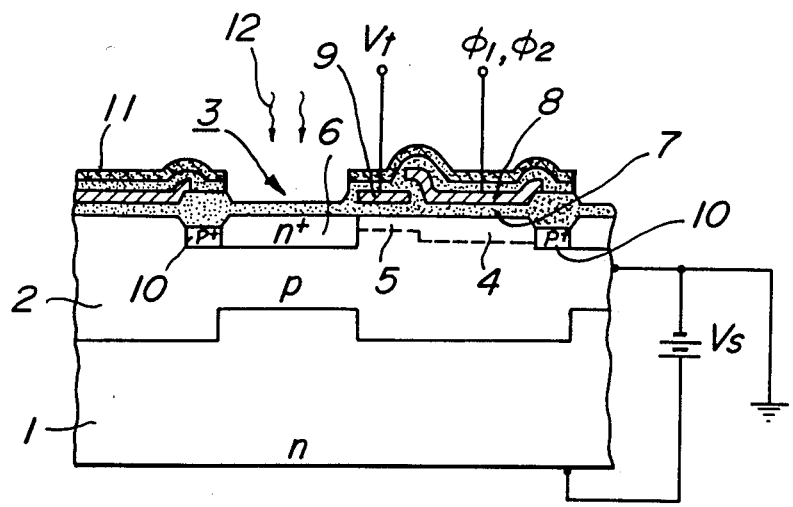
FIG. 1 is a cross sectional view showing an embodiment of a conventional CCD image sensor of OFD type.
Figure 2:
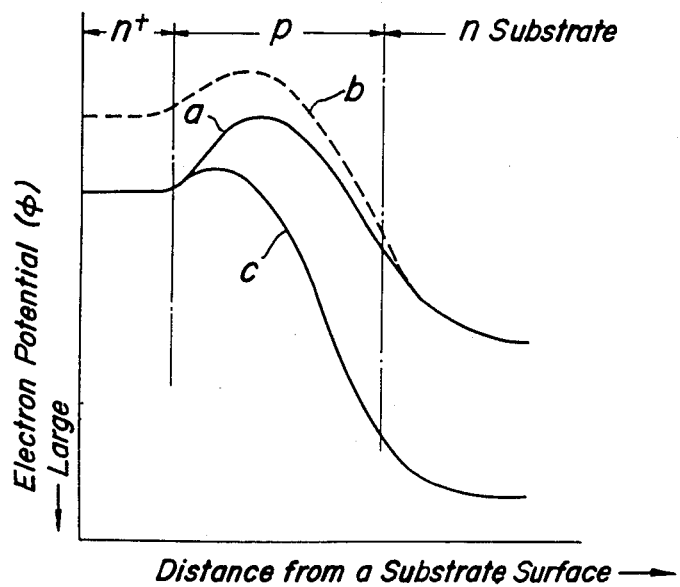
FIG. 2 is a graph illustrating potential distributions in a depth direction of a substrate of the CCD image sensor shown in FIG. 1.
Figure 3A:
FIGS. 3A to 3D are schematic views depicting voltage waveforms applied to the CCD image sensor shown in FIG. 1.
Figure 3B:
Figure 3C:
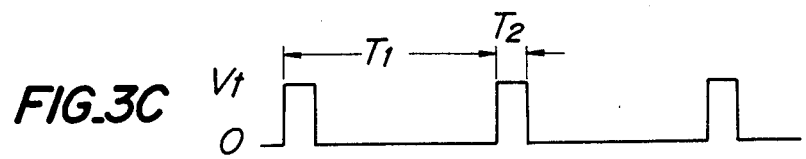
Figure 3D:
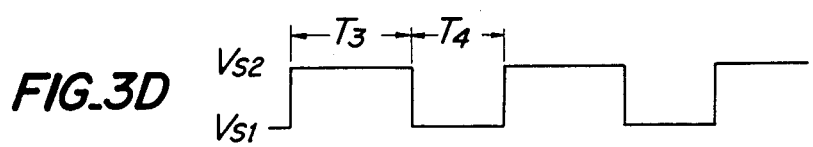
Figure 4:
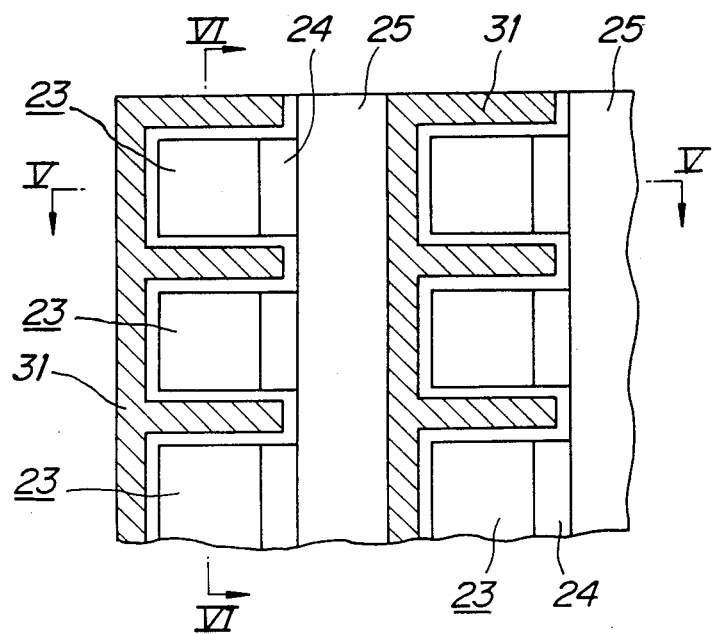
FIG. 4 is a plan view showing schematically a main portion of the solid state image pick-up device according to the invention.
Figure 5:
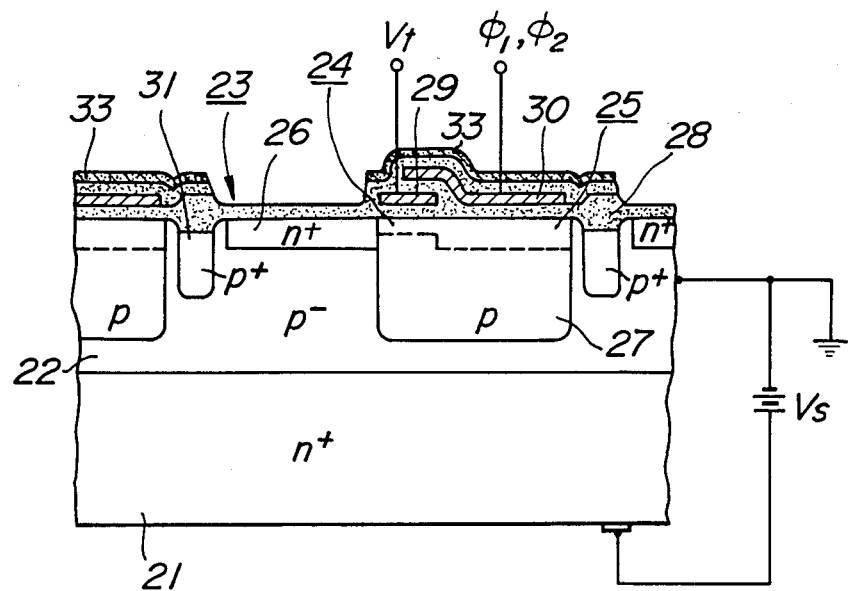
FIGS. 5 and 6 are cross sectional views cut along line V—V and line VI—VI, respectively shown in FIG. 4.
Figure 6:
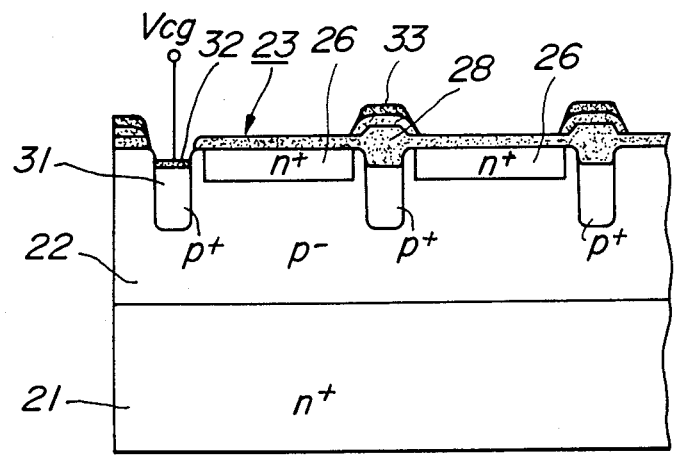

FIGS. 4 to 6 show an embodiment of the solid state image pick-up device according to the invention. In FIG. 4, a main portion of a light receiving portion and a vertically transferring portion are shown. In FIGS. 5 and 6, are cross sectional views cut along line V—V and a line VI—VI, respectively as illustrated in FIG. 4. In FIGS. 4 to 6, numeral 21 denotes a common semiconductor substrate, for example, an n+ type silicon single crystal substrate and numeral 22 represents an epitaxial silicon p⁻ layer having an impurity concentration of $10^{12}$ to $10^{14}$ atoms.cm⁻³ which has been grown on a major surface of the substrate 21. On the p⁻ layer 22, are formed a plurality of light receiving portions 23, each constituting a pixel which are arranged in a matrix form at a predetermined interval, CCD transferring portions 25 for transferring vertically stored charges in the light receiving portions 23, the transferring portions being arranged along a plurality of vertically aligned light receiving portions 23, and transferring gates 24 for transferring the stored charges in the light receiving portions 23 to related transferring portions 25, the transferring gates being arranged on one side of each light receiving portion 23. The light receiving portion 23 comprises of the p⁻ layer 22 and an n+ region 26 formed by diffusing n-type impurities such as phosphorus and arsenic into a predetermined region of the epitaxial silicon p⁻ layer 22 having almost intrinsic resistivity. The transferring gate 24 is formed by means of a gate electrode 29 provided above a p-type well 27 via an insulating layer 28 such as SiO₂ having a predetermined thickness. The p-type well 27 is formed in the p⁻ layer 22 adjacent to the n+ region 26 of the light receiving portion 23. The transferring gate electrode 29 is formed of, for example, a polycrystal silicon or a metal film having a high melting point such as tungsten, molybdenum, etc. The vertically transferring portion 25 is induced by means of a plurality of shift electrodes 30 which are provided along a vertical line above the p-type well 27 through the insulating layer 28 having a predetermined thickness, and is arranged opposite to each light receiving portions 23 aligned in the vertical direction. Moreover, it is not shown in the figure, but every other shift electrodes 30 are, for example, connected commonly and the clock pulses $\phi_1$ and $\phi_2$ are applied thereto respectively. Further, in this embodiment, a control gate 31 for controlling the potential of the p⁻ layer 22 i.e. the potential barrier of the light receiving portion 23 is formed, for example, as a p⁺ diffusion region which substantially surrounds the light receiving portion 23 as shown in FIG. 4. An electrode 32 is provided on the control gate 31 and this electrode 32 is formed of aluminum. The control gate 31 serves not only to control the potential of the p⁻ layer 22 but also as a channel stopper for preventing a leakage of the stored charge between the pixels. Numeral 33 represents a light shielding layer to prevent light from impinging upon portions other than the light receiving portion 23 and this shielding layer 23 is formed of, for example, aluminum.

Next, an operation of the solid state image pick-up device according to the invention will be explained.

At first, in order to drive the CCD vertically transferring portion 25 by means of two-phase clocks, the clock pulses $\phi_1$ and $\phi_2$ shown in FIGS. 7A and 7B are applied to alternate shift electrodes 30 and a predetermined pulse voltage $V_t$ is applied to the transferring gate electrode 29 at the predetermined interval, for example, one field period $T_1$ as shown in FIG. 7C. On the contrary, pulse voltages $V_s$ and $V_{cg}$, respectively shown in FIGS. 7D and 7E are applied to the n⁺ substrate 21 and the control gate 31, respectively in synchronism with the transferring gate pulse voltage $V_t$. A duration $T_3$ shown in FIGS. 7D and 7E denotes a period in which the signal charge is not stored in the light receiving portion 23 i.e. a period corresponding to the shutter close period in which the signal charge in the light receiving portion 23 is discharged into the substrate 21 which then serves as the overflow drain. During this duration $T_3$, predetermined voltages $V_{s2}$ and $V_{cg2}$ which are higher than standard voltages $V_{s1}$ and $V_{cg1}$, respectively are applied to the n⁺ substrate 21 and the control gate 31, respectively. Moreover, a duration $T_4$ denotes a charge storing period corresponding to the shutter open period. During this duration $T_4$, the standard voltages $V_{s1}$ and $V_{cg1}$ are applied to the n⁺ substrate 21 and the control gate 31, respectively. If it is assumed that the standard voltages $V_{s1}$ and $V_{cg1}$ are +15 V and −5 V, respectively, the voltages $V_{s2}$ and $V_{cg2}$ applied to the n⁺ substrate 21 and the control gate 31, respectively are +30 V and 0 V, respectively.

The behavior of the signal charge in the case where the light is made incident upon the light receiving portion 23 under such a voltage condition will be explained with reference to FIG. 8 showing the electron potential distribution in the substrate depth direction. In FIG. 8, the curve a shows the potential distribution in the case where there is no remaining stored charge when the standard voltage $V_{s1}$ is applied to the n⁺ substrate 21 and the curve b also shows the potential distribution in the case where there is remaining stored charge when the standard voltage $V_{cg1}$ is applied to the control gate 31. Since a negative bias voltage (for example −5 V) is applied to the control gate 31, the potential of the p⁻ layer 22 is decreased due to an electrostatic induction and the potential barrier between the p⁻ layer 22 and the n⁺ region 26 is larger as compared with a non-biased case. Contrary to this, if a positive bias voltage $V_{s1}$ is applied to the n⁺ substrate 21, the potential barrier is correspondingly smaller. Therefore, it is possible to set the magnitude of the potential barrier at a suitable value which is sufficient to discharge only excess charge into the substrate as shown by the curve b in FIG. 8 by selecting suitable standard voltages $V_{s1}$ and $V_{cg1}$. The values of the standard voltages $V_{s1}$ and $V_{cg1}$ applied during the charge storing duration $T_4$ shown in FIGS. 7D and 7E are set to achieve such a condition. On the contrary, in order to discharge the signal charge stored in the n⁺ region 26 into the substrate side, the voltage applied to the control gate 31 is set to 0 V or a positive bias voltage and further the reverse bias voltage applied to the n⁺ substrate 21 is made larger up to the $V_{s2}$. In this case, the potential distribution is denoted by the curve c shown in FIG. 8 and the potential barrier between the n⁺ region 26 and the p⁻ layer 22 is smaller as compared with the case (the curve d in FIG. 8) that only the reverse bias voltage $V_{s2}$ is applied to the n⁺ substrate 21. Therefore, all the signal charge stored in the n⁺ region 26 can be discharged into the substrate 21. During the duration $T_3$ shown in FIGS. 7D and 7E, the voltages $V_{s2}$ and $V_{cg2}$ are set to attain such a condition. Therefore, no charge remains at all in the light receiving portion 23 and the shutter is completely closed.

In this manner, since the signal charge in the light receiving region can be alternately stored and completely discharged by setting the voltages applied to the control gate 31 and the substrate 21 to the standard voltages $V_{cg1}$ and $V_{s1}$ and the higher voltages $V_{cg2}$ and $V_{s2}$, respectively, it is possible to set the charge storing period i.e. the shutter opening duration arbitrarily within the predetermined duration i.e. one field scanning period $T_1$, by suitably changing respective voltage durations. In this manner, according to the invention the desired shutter function can be performed, while the signal charge does not remain in the light receiving region and thus high, uniform sensitivity is attained.

In the embodiment mentioned above, the pulsatory reverse bias voltage is applied to the n⁺ substrate 21, but it is possible to utilize the shutter function by applying a direct current bias voltage having the magnitude of $V_{s1}$ to the n⁺ substrate 21. However, in this case, since the potential barrier of the light receiving region must be decreased only by the bias voltage $V_{cg1}$ applied to the control gate 31, the value of the bias voltage $V_{cg2}$ during the period $T_3$ must be set higher as compared with the case that the bias voltage $V_{cg2}$ is applied to the control gate 31 in addition to the bias voltage $V_{s2}$ applied to the substrate 21.

Moreover, in the embodiment mentioned above, the transferred gate and the CCD vertically transferring portion of the signal charge supplied from the light receiving region has a surface channeling construction, but the present invention is not limited to such a construction and a bulk channeling construction may also be used. Further, in the embodiment mentioned above, the transferring gate electrode and the shift electrode are separately arranged, but it is possible to achieve the same function by commonly providing these electrodes and by changing suitably the clock pulse waveform applied to the CCD vertically transferring portion.

As mentioned above, according to the invention, in the CCD solid state sensor of the vertical OFD type, the light receiving region is constituted of the p⁻ layer arranged on the main surface of the n+ substrate and the n+ diffusion region provided in the p⁻ layer, and the control gate for controlling the potential barrier between the n+ diffusion region and the p⁻ layer is arranged adjacent to the light receiving region to perform the storing and discharging operation of the signal charge in the light receiving region by controlling the control voltage applied to the control gate or both the control voltage and that applied to the n+ substrate. Therefore, before the charge storing operation, i.e. when the reset operation (shutter closing condition) is performed, it is possible to make the potential barrier of the light receiving portion sufficiently small and to completely discharge all the charge stored in the light receiving region into the overflow drain. As a result, a ratio of the signal to the dark current component (S/N) is improved and a spectral sensitivity and a dynamic range can be improved by more than 10 to 20 percent as compared with the conventional vertical OFD type CCD element.

Further, since the light receiving region is formed on the epitaxial silicon p⁻ layer having nearly the intrinsic resistivity, the junction capacity of the photodiode constituting the light receiving region becomes small and thus a light response speed can be improved.

Furthermore, in the case where the magnitude of the potential barrier of the light receiving region is controlled by the bias voltage applied to the substrate as well as by the electrostatic induction due to the voltage applied to the control gate, it is possible to make smaller the reverse bias voltage applied to the substrate i.e. the power supply voltage as compared with the case where the charge stored in the light receiving region is discharged only by controlling the reverse bias voltage applied to the substrate in the conventional manner.

What is claimed is:

1. A solid state image pick-up device with a shutter function comprising:
   a semiconductor substrate of a first conductivity type;
   an epitaxial layer of a second conductivity type provided on a main surface of the substrate;
   a plurality of surface regions of the first conductivity type formed in a surface of the epitaxial layer, each surface region, together with a portion of the epitaxial layer situated underneath the surface region, constituting a light receiving region of a charge coupled device of vertical overflow drain type;
   a plurality of well regions of the second conductivity type formed in the epitaxial layer, each well region formed adjacent to respective surface regions for transferring a signal charge stored in the respective surface region;
   a plurality of control gates of the second conductivity type having an impurity concentration higher than that of the well regions and formed in the epitaxial layer in the vicinity of respective surface regions, the control gates extending deeper into said epitaxial layer than the surface regions;
   means for applying a variable bias voltage across said substrate and said epitaxial layer; and
   means for applying a variable control voltage, having a magnitude different from said bias voltage, to said control gates to control a potential barrier between the surface regions and epitaxial layer in a static induction mode whereby during a first time period corresponding to a shutter-closed time the signal charge stored in the surface region flows into the substrate, and during a second time period corresponding to a shutter-open time the signal charge is stored in the surface region.

2. A solid state image pick-up device as recited in claim 1 wherein said epitaxial layer has an impurity concentration in the range of $10^{12}$ to $10^{14}$ atoms/cm$^3$.

3. A device according to claim 1, wherein said well region and control gate are provided on opposite sides of said surface region.

4. A device according to claim 1, wherein said well region is to one side of said surface region having a substantially rectangular surface configuration and said control gate surrounds the remaining sides of said surface region.

5. A device according to claim 1, wherein said surface region is a diffusion region having a high n-type impurity concentration.

6. A device according to claim 5, wherein said control gate is a diffusion region having a high p-type impurity concentration.

7. A device according to claim 1, wherein said bias voltage is applied in synchronism with said control voltage applied to said control gate.

8. A device according to claim 1, wherein said bias voltage is a direct current voltage having a predetermined amplitude.

9. A charge coupled device for use in a solid state image pick-up device comprising:
   a semiconductor substrate of a first conductivity type;
   an epitaxial layer of a second conductivity type provided on a main surface of the substrate;
   a surface region of the first conductivity type formed in a surface of the epitaxial layer, the surface region, together with a portion of the epitaxial layer situated underneath the surface region, constituting a light receiving region;
   a well region of the second conductivity type formed in the epitaxial layer adjacent to the surface region for transferring a signal charge stored in the surface region;
   a control gate of the second conductivity type having an impurity concentration higher than that of the well region and formed in the epitaxial layer in the vicinity of the surface region, the control gate extending deeper into said epitaxial layer than the surface region;
   a conductor for connecting a variable bias voltage source between said substrate and said epitaxial layer; and
   a conductor for connecting said control gate to a variable control voltage source, having a magnitude different from said bias voltage source, for applying a control voltage to the control gate for controlling a potential barrier between the surface region and expitaxial layer in a static induction mode whereby during a first time period corresponding to a shutter-closed time the signal charge stored in the surface region flows into the substrate, and during a second time period corresponding to a shutter-open time the signal charge is stored in the surface region.

10. A charge coupled device as recited in claim 9 wherein said epitaxial layer has an impurity concentration in the range of $10^{12}$ to $10^{14}$ atoms/cm$^3$.

11. A device according to claim 9, wherein said semiconductor substrate is a semiconductor body having a high n-type impurity concentration, said epitaxial layer is an epitaxially grown layer having a low p-type impurity concentration, and said surface region is a diffusion region having a high n-type impurity concentration.

* * * * *